US009142650B2

(12) United States Patent
Wang et al.

(10) Patent No.: US 9,142,650 B2
(45) Date of Patent: Sep. 22, 2015

(54) TILT IMPLANTATION FOR FORMING FINFETS (71) Applicant: Taiwan Semiconductor Manufacturing Company Limited, Hsinchu (TW)

(72) Inventors: Tsan-Chun Wang, Hsinchu (TW); Zi-Wei Fang, Hsinchu County (TW); Tze-Liang Lee, Hsinchu (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 0 days.

(21) Appl. No.: 14/029,848

(22) Filed: Sep. 18, 2013

(65) Prior Publication Data
US 2015/0079750 A1    Mar. 19, 2015

(51) Int. Cl.
*H01L 29/66*    (2006.01)
*H01L 21/265*    (2006.01)
*H01L 21/22*    (2006.01)

(52) U.S. Cl.
CPC .......... *H01L 29/66803* (2013.01); *H01L 21/22* (2013.01); *H01L 21/26586* (2013.01)

(58) Field of Classification Search
CPC .... H01L 21/02518; H01L 21/20; H01L 21/38
See application file for complete search history.

(56) References Cited

U.S. PATENT DOCUMENTS

| 7,993,999 | B2 | 8/2011 | Basker et al. | |
| 8,283,231 | B2 | 10/2012 | Merelle et al. | |
| 2008/0003725 | A1* | 1/2008 | Orlowski | 438/149 |
| 2009/0124069 | A1* | 5/2009 | Clark et al. | 438/525 |
| 2011/0171795 | A1* | 7/2011 | Tsai et al. | 438/232 |
| 2011/0175165 | A1* | 7/2011 | Yu et al. | 257/347 |
| 2011/0227165 | A1 | 9/2011 | Basker et al. | |
| 2013/0078772 | A1 | 3/2013 | Yuan et al. | |
| 2013/0113042 | A1 | 5/2013 | Wang et al. | |

* cited by examiner

*Primary Examiner* — Cheung Lee
(74) *Attorney, Agent, or Firm* — Jones Day (57) ABSTRACT Methods for fabrication of fin devices for an integrated circuit are provided. Fin structures are formed in a semiconductor material, where the fin structures include sidewalls and tops. Dopant implantation is performed at a tilt angle to form a doped region along the sidewalls and the tops of the fin structures, where the semiconductor material is maintained at an elevated temperature during the dopant implantation. The elevated temperature prevents amorphization of the fin structures during the dopant implantation. A field effect transistor is formed from the fin structures. The field effect transistor has a threshold voltage that is based on the dopant implantation.

20 Claims, 6 Drawing Sheets

TILT IMPLANTATION FOR FORMING FINFETS

TECHNICAL FIELD

The technology described in this disclosure relates generally to semiconductor fabrication and more particularly to methods for fabrication of fin devices for integrated circuits.

BACKGROUND

The semiconductor integrated circuit (IC) industry has experienced rapid growth. Technological advances in IC materials and design have produced generations of ICs where each generation has smaller and more complex circuits than the previous generation. For example, the semiconductor industry has sought to decrease the size of memory cells. One strategy that has been employed includes the use of multiple gate transistors, including fin field effect transistors (FinFETs).

SUMMARY

The present disclosure is directed to methods for fabrication of fin devices for an integrated circuit. In a method for fabrication of fin devices for an integrated circuit, fin structures are formed in a semiconductor material, where the fin structures include sidewalls and tops. Dopant implantation is performed at a tilt angle to form a doped region along the sidewalls and the tops of the fin structures, where the semiconductor material is maintained at an elevated temperature during the dopant implantation. The elevated temperature prevents amorphization of the fin structures during the dopant implantation. A field effect transistor is formed from the fin structures. The field effect transistor has a threshold voltage that is based on the dopant implantation.

In another example, in a method for fabrication of fin devices for an integrated circuit, fin structures are formed in a semiconductor material, where the fin structures include sidewalls and tops. A first set of fin structures is masked. A dopant implantation is performed at a tilt angle to form a doped region along the sidewalls and the tops of a second set of fin structures. The semiconductor material is maintained at an elevated temperature during the dopant implantation. A mask is removed from the first set of fin structures. Field effect transistors are formed from the first set of fin structures and the second set of fin structures. A conductivity type of the field effect transistors formed from the first set of fin structures differs from a conductivity type of the field effect transistors formed from the second set of fin structures. The field effect transistors formed from the second set of fin structures have a threshold voltage that is based on the dopant implantation.

DETAILED DESCRIPTION

The present disclosure provides fin field effect transistors (FinFETs), and processes for fabricating the same, where the FinFETs may have multiple, tunable threshold voltages. Being able to control the threshold voltage in a device may be used to provide power savings in the device without commonly encountered performance degradation. For example, an electronic device having FETs with two different threshold voltages (e.g., $V_{t2} < V_{t1}$) may be operated effectively in both a low power mode when a supply voltage Vdd is $V_{t2} < Vdd < V_{t1}$, and in a high power mode when Vdd is greater than $V_{t1}$. The use of multiple, tunable threshold voltages may have numerous other uses in devices.

Figure 1:
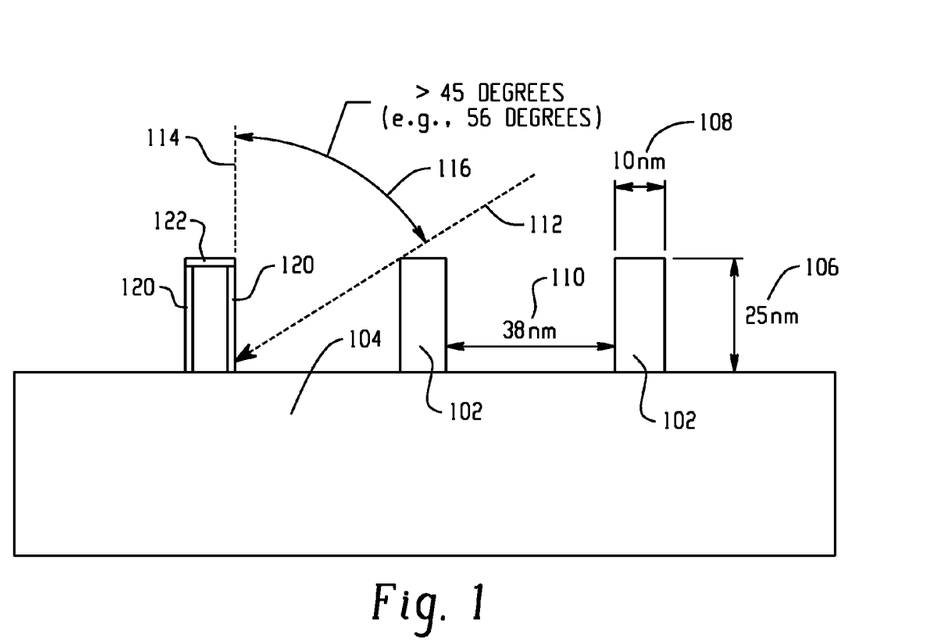
FIG. 1 depicts a cross-sectional view of an example intermediate stage in the fabrication of a fin field effect transistor (FinFET).

FIG. 1 depicts a cross-sectional view of an example intermediate stage in the fabrication of a FinFET. In the example intermediate stage, fin structures 102 may be formed in a semiconductor material 104. The semiconductor material 104 may be, for example, monocrystalline silicon of a particular conductivity type (e.g., N-type silicon or P-type silicon). In the example of FIG. 1, the fin structures 102 may have heights 106 of approximately 25 nanometers and widths 108 of approximately 10 nanometers, and adjacent fin structures 102 may be separated by a spacing 110 of approximately 38 nanometers. Such heights 106, widths 108, and spacings 110 are exemplary only, and numerous other dimensions may be used in other examples. The fin structures 102 may include sidewall portions and top portions (e.g., exemplary sidewall portions 120 and top portion 122, as depicted in FIG. 1).

In the example of FIG. 1, a dopant implantation (symbolized by an arrow 112) may be performed at a tilt angle 116 to form a doped region along the sidewall portions and the top portions of the fin structures 102. In particular, the tilt angle 116 may be chosen to cause an amount of doping at the sidewall portions and the top portions of the fin structures 102 to be approximately equal. In some examples, the top portions may have a slightly higher amount of doping as compared to the sidewall portions, but the difference in doping between the top and sidewall portions may be substantially reduced by selecting an adequately large tilt angle 116. For example, a dopant implantation performed at too low a tilt angle 116 may cause the top portions of the fin structures 102 to be more heavily doped as compared to parts of the sidewall portions (e.g., bottom parts of the sidewall portions that are near the substrate 104). The tilt angle 116 may be greater than 45 degrees (e.g., 56 degrees), where the tilt angle 116 may be measured relative to a plane 114 that is substantially parallel to sidewalls of the fin structures 102.

In other examples, the tilt angle 116 may be chosen to be a maximum tilt angle that is allowed by the fin structures 102, where the maximum tilt angle is the largest angle that allows a particular fin structure to receive a dopant without the dopant being impeded by a fin structure that is adjacent to the particular fin structure. Although the example of FIG. 1 depicts the single arrow 112 to illustrate an angle of the dopant implantation, it should be understood that all of the fin structures 102 may receive the dopant via the implantation process. In other examples, certain of the fin structures 102 may be masked, such that doped regions are not formed in the masked fin structures. The masking may be used, for example, to protect PMOS fin structures while implanting NMOS fin structures, and vice versa.

Following the dopant implantation, one or more field effect transistors may be formed using the fin structures 102. The one or more field effect transistors formed may be FinFETs (e.g., multiple gate FinFET transistors). The subsequent steps used in forming the one or more field effect transistors may include, for example, formation of a gate structure substantially over the fin structures 102. A typical FinFET may be fabricated with the vertical fin structures 102 extending from the substrate 104, where the fin structures 102 may be formed by, for example, etching away a portion of a silicon layer of the substrate 104. A channel portion of the FinFET may be formed in the vertical fin structures 102. The gate structure may be provided substantially over the fin structures 102 (e.g., the gate structure may wrap the fin structures 102).

The field effect transistors formed from the fin structures 102 may each be characterized as having a threshold voltage. The threshold voltage may be a value of the gate-source voltage when a conducting channel of the transistor just begins to connect source and drain contacts of the transistor, allowing significant current to flow. In the example of FIG. 1, the threshold voltage for the field effect transistors may be dependent on aspects of the dopant implantation. For example, the fin structures 102 may be comprised of a silicon material, and the dopant implantation may use a dopant that includes germanium, such that the doped region formed by the dopant implantation includes the germanium (e.g., the doped region may include silicon germanium (SiGe)). The germanium implantation may be used to change the threshold voltage of the field effect transistors.

In one example, a particular fin structure of the fin structures 102 may cause a field effect transistor to have a first threshold voltage if the particular fin structure is not doped via the germanium dopant implantation. However, if the particular fin structure is subject to the germanium dopant implantation, the field effect transistor may instead have a second threshold voltage that is different from the first threshold voltage. In one example, the threshold voltage of the field effect transistor may be changed by controlling a dosage of the germanium dopant implantation, where a magnitude of the change in the threshold voltage may be proportional to the dosage. In this manner, the threshold voltage of the field effect transistor may be tuned by controlling aspects of the germanium dopant implantation.

The dopant implantation may be performed at an elevated temperature. In one example, an atmosphere in which the dopant implantation occurs may be heated to a temperature that is greater than approximately 450 degrees Celsius, and the wafer itself (i.e., including the substrate 104 and the fin structures 102) may be heated to a temperature that is greater than approximately 400 degrees Celsius. The elevated temperature for the dopant implantation may substantially prevent amorphization (e.g., damage to) of the fin structures 102 during the dopant implantation. Prevention of the amorphization of the fin structures 102 may lower a number of defects in the fin structures 102.

Figure 2A:
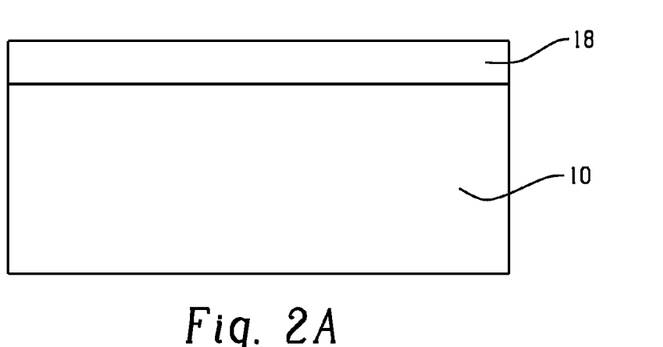
FIGS. 2A, 2B, 2C, 2D, 2E, and 2F depict cross-sectional views of intermediate stages of an example fabrication process for forming fin devices for an integrated circuit.

FIGS. 2A, 2B, 2C, 2D, 2E, and 2F depict cross-sectional views of intermediate stages of an example fabrication process for forming fin devices for an integrated circuit. In FIG. 2A, a substrate 10 is shown having a cap layer or dielectric liner 18 formed thereon. The substrate 10 may be formed of silicon, for example. Although the substrate 10 may be depicted in FIG. 2A as a bulk wafer including a single material (e.g., a bulk silicon wafer), in other examples, a semiconductor-on-insulator or silicon-on-insulator (SOI) wafer may instead be used. Where such an SOI wafer is used, the dielectric liner 18 may be formed substantially over a top silicon layer of the SOI wafer, where the SOI wafer may also include an insulating layer (e.g., an oxide layer) that is formed between the top silicon layer and a silicon base layer (e.g., a bottom silicon layer).

Any suitable material for the substrate 10 may be used, and the material for the substrate 10 may not be limited to silicon. For example, the substrate 10 may be a bulk substrate that may include gallium arsenide, germanium, or any other material or combination of materials. Further, the substrate 10 may include other features or structures that are formed on or in the substrate 10 in previous processing steps. The dielectric liner 18 may include a dielectric material that enables etching of the substrate 10. In one example, the substrate 10 may be monocrystalline silicon, and the dielectric liner 18 may include silicon nitride. Liner 18 may be deposited substantially over the substrate 10.

Figure 2B:
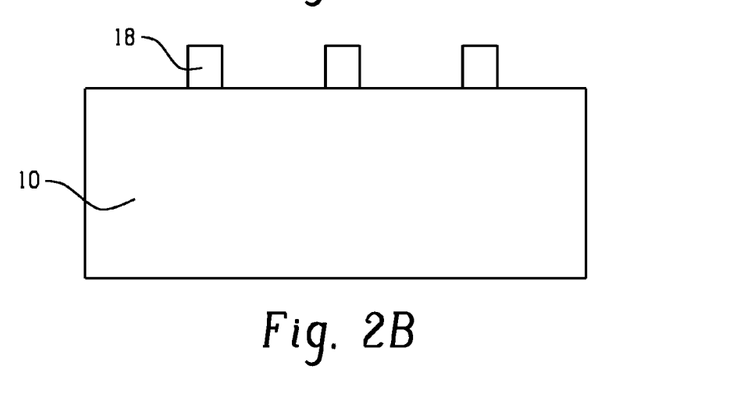

FIG. 2B depicts an example patterning of the dielectric liner 18. The patterning may be performed using, for example, a lithographic patterning process. The patterning may include steps for forming sub-minimum feature-sized fins (e.g., steps that allow fins to have widths that are less than or equal to a minimum feature size achievable by lithography, such as a spacer image transfer (SIT) process.

Figure 2C:
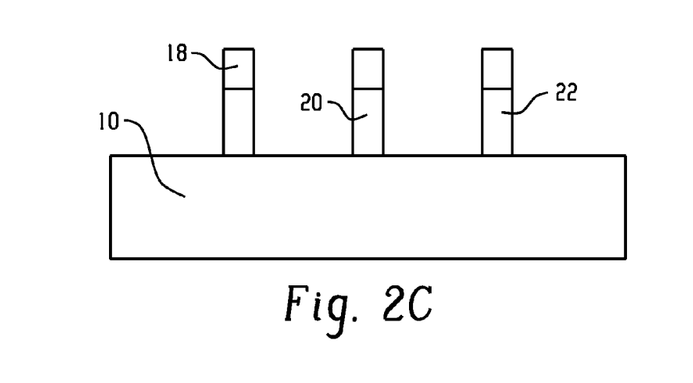

FIG. 2C depicts an example patterning of the substrate 10 to form fins 20, 22, where features of the patterned dielectric liner 18 may be used as a mask in the patterning of the substrate 10. For example, after the dielectric liner 18 is patterned, an etch process may be used to remove a portion of the substrate 10, thus forming the fins 20, 22. The etch process may include, for example, a reactive ion etch (RIE) process. As illustrated in FIG. 2C, the fins 20, 22 include sidewall portions and top portions (e.g., sidewall and top portions similar to those depicted in FIG. 1 at 120 and 122, respectively).

The substrate 10 may provide a semiconductor material from which fin field effect transistors (FinFETs) may be formed. For example, the substrate 10 may include a silicon material that has been doped to be of an N-type conductivity or a P-type conductivity. In one example, the fin 20 may be used for forming an nFET device, and the fin 22 may be used for forming a pFET device. In other examples, both of the fins 20, 22 may be employed to form devices of a single type (i.e., the fins 20, 22 may both be used in forming nFETs, or the fins 20, 22 may both be used in forming pFETs).

Figure 2D:
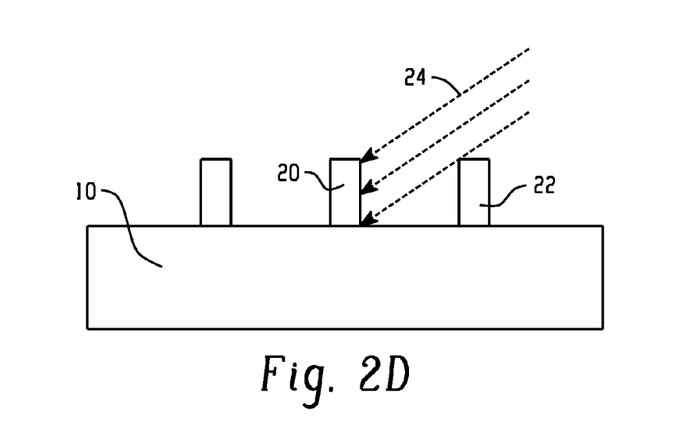

FIG. 2D depicts a first example dopant implantation (symbolized by arrows 24) that is performed at a tilt angle. The first dopant implantation may form a doped region along sidewalls and tops of the fins 20, 22, where the doped region may include a dopant used in the first dopant implantation. The first dopant implantation may be performed at a fin recess stage of the transistor fabrication process, such that the first dopant implantation may be performed prior to forming gate structures on the substrate 10. Performing the first dopant implantation at this stage in the fabrication process may allow a larger tilt angle to be used, where the tilt angle may be measured from a plane that is substantially parallel to the sidewalls of the fins 20, 22. For example, if the first dopant implantation is performed after the formation of the gate structures on the substrate 10, the tilt angle may be constrained to a maximum of approximately 19 degrees. The tilt angle may be constrained to the maximum of approximately 19 degrees due to the height of the gate structures. For example, the height of the gate structures may be greater than the height of the fins 20, 22, such that one or more of the fins 20, 22 cannot receive a dopant unless the tilt angle of the first dopant implantation is constrained to an angle of approximately 19 degrees or lower. This constraining of the tilt angle may be known as the shadowing effect. The constraining of the tilt angle may be disadvantageous, as implanting a dopant on the sidewalls of the fins 20, 22 may be difficult due to the relatively low tilt angle.

By contrast, if the first dopant implantation is performed prior to forming the gate structures, as illustrated in FIG. 2D, the larger tilt angle may be used (e.g., the tilt angle 116 as illustrated in FIG. 1, which may be greater than 45 degrees or set to a maximum tilt angle as allowed by adjacent fin structures). The use of the larger tilt angle may allow an amount of doping at the tops and the sidewalls of the fins 20, 22 to be substantially equal. Further, performing the first dopant implantation at the larger tilt angle may cause an amount of doping at uppermost portions of the sidewalls and bottom portions of the sidewalls to be substantially equal. Achieving equal doping throughout the tops and sidewalls of the fins 20, 22 may be known as conformal doping. The approximately equal doping throughout the tops and sidewalls of the fins 20, 22 may be evidenced by the thickness of the doped region in the fins 20, 22. As described above, the first dopant implantation may cause the doped region to be formed along the sidewalls and the tops of the fins 20, 22. In the conformal doping implantation at the larger tilt angle, the thickness of the doped region may be approximately equal in the top and sidewall portions of the fins 20, 22.

A dopant used for the first dopant implantation 24 may include germanium. In one example, where the fins 20, 22 are formed in a silicon material, the germanium dopant may form a dipole with the silicon material. The dipole formation may be used to tune a threshold voltage of a FinFET transistor that is formed using the fins 20, 22. In one example, the threshold voltage the FinFET transistor may be changed by controlling a dosage of the germanium dopant implantation, where a magnitude of the change in the threshold voltage may be proportional to the dosage. For example, when the field effect transistor is a p-type field effect transistor, the germanium dopant implantation may reduce the threshold voltage of the field effect transistor, such that a higher dosage causes a greater reduction of the threshold voltage. Conversely, when the field effect transistor is an n-type field effect transistor, the germanium dopant implantation may increase the threshold voltage of the field effect transistor, such that a higher dosage causes a greater increase in the threshold voltage.

Although both of the fins 20, 22 may receive the dopant in the example of FIG. 2D, in other examples, one or more of the fins 20, 22 may be masked during the first dopant implantation. By masking the one or more of the fins 20, 22, certain of the fins 20, 22 may undergo the threshold voltage tuning caused by the first dopant implantation, while other fins may be unaffected.

The first dopant implantation may be performed at an elevated temperature (e.g., greater than 400 degrees Celsius) to prevent amorphization of the fins 20, 22 during the dopant implantation. For example, an atmosphere in which the first dopant implantation occurs may be heated to a temperature of greater than approximately 450 degrees Celsius, and the wafer itself (e.g., including the substrate 10 and the fins 20, 22 formed on the substrate 10) may be heated to a temperature of greater than approximately 400 degrees Celsius during the dopant implantation. Amorphization of the fins 20, 22 may occur at atmosphere temperatures that are less than 450 degrees Celsius, where the amorphization may be evidenced by necking in the fins 20, 22 or lateral amorphization merging at the center of the fins 20, 22 (e.g., in a fin having a nominal width of 10 nanometers, the necking or the lateral amorphization may cause the fin to have a fin width that is less than the nominal fin width of 10 nanometers). In one example, a heater (e.g., a beam line heater manufactured by Thermion Systems International, Inc.) may be used to heat the atmosphere and the wafer during the dopant implantation.

Figure 2E:
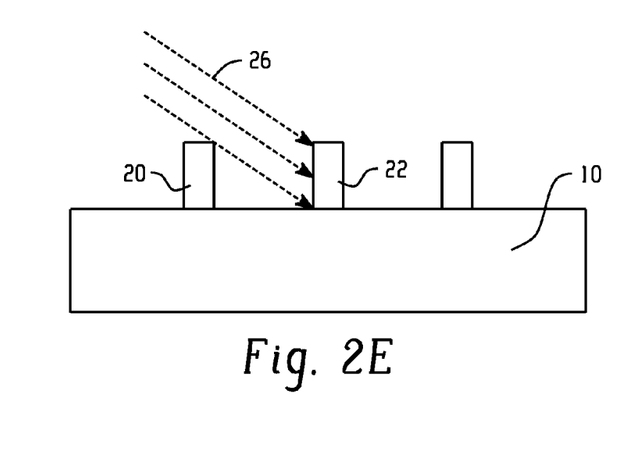

FIG. 2E depicts a second tilt implantation (symbolized by arrows 26). The second tilt implantation may be performed in a tilt direction that is opposite that of the first tilt implantation described above with reference to FIG. 2D. For example, the first tilt implantation may be considered to use a tilt in the −X direction, and the second tilt implantation depicted in FIG. 2E may be considered to use a tilt in the +X direction. Thus, the process described in FIGS. 2D and 2E may implement a two-step implantation procedure, where the two steps may be used to ensure that all sides of the fins 20, 22 receive an approximately equal dosage.

The second tilt implantation may be performed in a manner that is similar to that used in the first tilt implantation, such that the second tilt implantation is performed i) at a tilt angle to achieve conformal doping along the sidewalls and tops of the fins 20, 22; ii) at a fin recess stage of the fabrication process (e.g., prior to forming gate structures on the substrate 10); and iii) at an elevated temperature (e.g., greater than approximately 400-450 degrees Celsius), where the elevated temperature prevents amorphization of the fins 20, 22 during the dopant implantation. Further, the first and the second tilt implantations may each use one half of a total dosage. For example, if a total dosage to be delivered is $2\times10^{15}/cm^2$, then the first implantation may be used to deliver a germanium dosage of $1\times10^{15}/cm^2$, and the second implantation may be used to deliver a germanium dosage of $1\times10^{15}/cm^2$. In this manner, the different sides of the fins 20, 22 may each receive half of the total dosage.

Figure 2F:
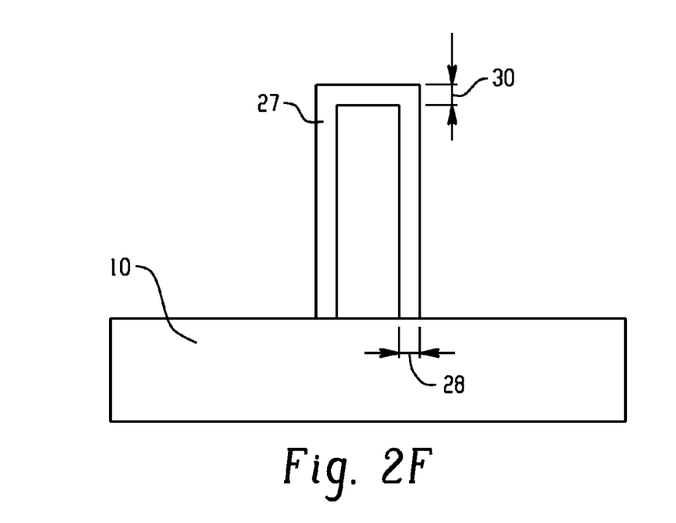

FIG. 2F depicts a fin 27 following the first and the second tilt implantations. The fin 27 may be, for example, either of the fins 20, 22 as depicted in FIGS. 2C, 2D, and 2E. By performing both of the first and the second tilt implantations at the larger tilt angle, a conformity of the resulting doping regions may be improved. As depicted in FIG. 2F, the sidewall portions of the fin 27 have doped regions of a thickness 28, and the top portions of the fin 27 have doped regions of a thickness 30. The thicknesses 28 and 30 may be approximately equal. Further, the thickness 28 of the doped regions of the sidewalls may be approximately equal at uppermost portions of the sidewalls and at bottom portions of the sidewalls.

Figure 3:
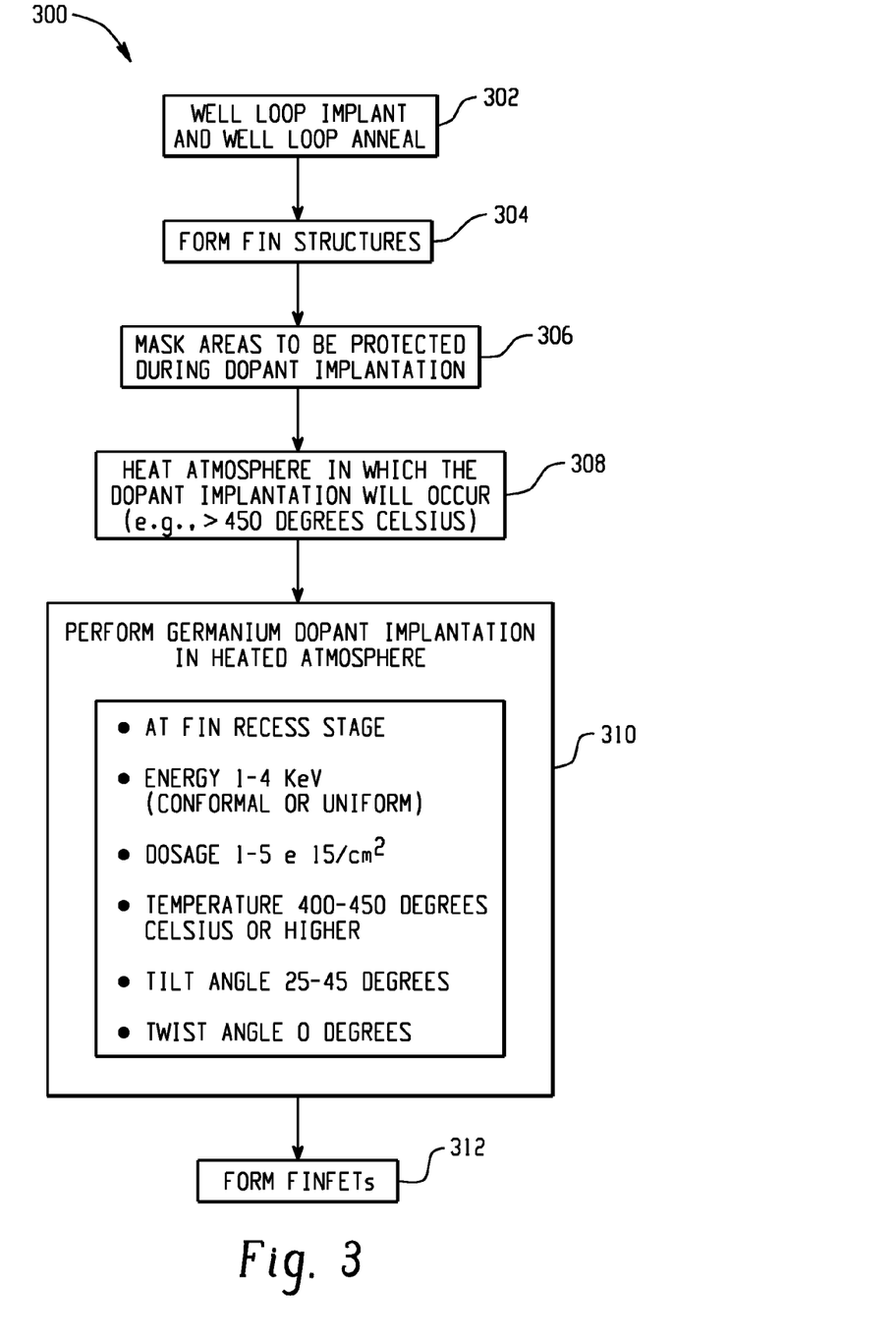
FIG. 3 depicts a flowchart illustrating aspects of an example implantation approach for forming FinFET devices with multiple threshold voltages.

FIG. 3 depicts a flowchart 300 illustrating aspects of an example implantation approach for forming FinFET devices with multiple threshold voltages. At 302, well loop implant and well loop anneal steps may be performed. The well loop implant step may be performed to define a large region of a semiconductor substrate as being N-type or P-type. For example, using the well loop implant step, a large region in a bulk N-type silicon substrate may be doped to be P-type silicon. Conversely, the well loop implant step may also be used to dope a large region in a bulk P-type silicon substrate to be N-type silicon. The well loop implant step may be performed, for example, when PMOS FinFETs are to be formed from an N-type silicon substrate or when NMOS FinFETs are to be formed from a P-type silicon substrate. The well loop anneal step may be performed following the well loop implant step and may be used to reduce an amount of defects caused by the well loop implantation process.

At 304, fin structures may be formed in the semiconductor material of the substrate (e.g., as described above, with reference to FIGS. 2A, 2B, and 2C). For example, the formation of the fin structures may include forming a mask for etching the semiconductor material and performing a subsequent etch of the semiconductor material. At 306, a mask layer may be deposited, where the deposited mask layer may be patterned using a resist layer and lithographic processing. The mask layer may be etched away from areas that will be implanted with a dopant (e.g., germanium) and maintained in areas that are to remain protected from the dopant. If a CMOS device is being formed with both nFET and pFET devices, then fin structures for the nFETs may be masked off during the pFET processing, and conversely, fin structures for the pFETs may be masked off during the nFET processing. At 308, an atmosphere in which the dopant implantation will occur may be heated. For example, the atmosphere may be heated to a temperature that is greater than 450 degrees Celsius.

At 310, a germanium dopant implantation is performed in the heated atmosphere to form a doped region in the unmasked fin structures. As illustrated in FIG. 3, the germanium dopant implantation may be performed at a fin recess stage of the fabrication process, such that the implantation may be performed prior to forming gate structures on the substrate. An energy of the germanium dopant implantation may be selected to be within a range of 1-4 KeV. The energy selected may determine whether the doping is conformal or uniform. The conformal doping may cause the doped region to exist only around outer edges of the fin structures. For example, the fin structure 27 depicted in FIG. 2F may have been doped in a conformal manner, such that the doped regions exist only at the edges of the fin structure 27 and not within an interior region of the fin structure 27. By contrast, the uniform doping may cause the doped region to exist throughout an entirety of the fin structures (i.e., in the uniform doping, the germanium dopant may be present at the interior region of the fin structures and not only at the outer edges of the fin structures). An energy within a range of approximately 1-2 KeV may create a conformal germanium doped region, and an energy that is greater than approximately 4 KeV may create a uniform germanium doped region.

The dosage of the germanium dopant implantation may be within a range of approximately $1 \times 10^{15}/cm^2$ to $5 \times 10^{15}/cm^2$. As described above, the total dosage may be divided between first and second implantations performed at different tilt directions (e.g., a −X tilt direction and a +X tilt direction, where one half of the total dosage is delivered at each of the two tilt directions). In one example, a threshold voltage of a field effect transistor formed using the fin structures may be changed by controlling the dosage of the germanium dopant implantation, where a magnitude of the change in the threshold voltage may be proportional to the dosage. In one example, a threshold voltage of a PMOS FET may be reduced by approximately 40 mV per $1 \times 10^{15}/cm^2$ germanium dosage (e.g., such that the threshold voltage may be reduced by 80 mV when doubling the germanium dosage to $2 \times 10^{15}/cm^2$, and so on). In another example, a threshold voltage of a NMOS FET may be increased by approximately 40 mV per $1 \times 10^{15}/cm^2$ germanium dosage (e.g., such that the threshold voltage may be increased by 80 mV when doubling the germanium dosage to $2 \times 10^{15}/cm^2$, and so on). In other examples, the change in the threshold voltage may not be proportional to the dosage (e.g., various other non-linear relationships between threshold voltage and dosage may be used).

A temperature maintained throughout the germanium dopant implantation may be within a range of 400-450 degrees Celsius, or the temperature may be higher than this range. The germanium dopant implantation may be performed at a tilt angle, as described above with respect to FIGS. 1, 2D, and 2E. The tilt angle may be within a range of approximately 25-45 degrees, for example. A twist angle of 0 degrees may be used in the germanium dopant implantation.

At 312, a field effect transistor or transistors may be fabricated from the fin structures. The fabrication of the field effect transistor or transistors may include forming a high dielectric constant gate dielectric and a gate conductor substantially over the fin structures. Other process steps may be performed in fabricating the field effect transistor or transistors (e.g., oxide formation substantially over the fin structures, annealing steps, or deposition of a polysilicon layer substantially over the fin structures, among others).

Figure 4:
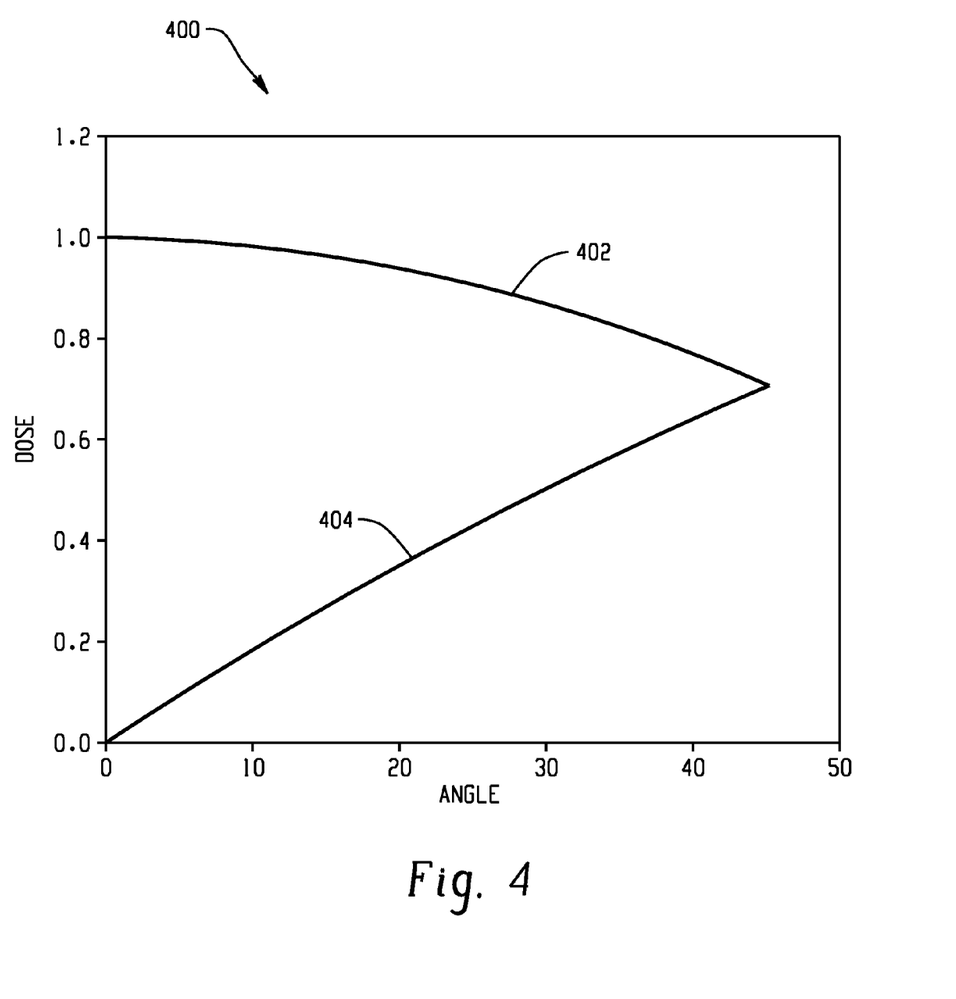
FIG. 4 depicts an example graph illustrating implantation dose versus tilt angle, where the curves represent implantation dose at a top portion and a sidewall portion of a fin device.

FIG. 4 depicts an example graph 400 illustrating implantation dose versus tilt angle, where the curves 402, 404 represent implantation dose at a top portion and a sidewall portion, respectively, of a fin structure. In FIG. 4, an x-axis may represent the tilt angle, where the tilt angle is measured from a plane that is substantially parallel to the sidewall portion of the fin structure, and a y-axis may represent the implantation dose, where the dose is normalized to be within a range of 0.0 to 1.0. The graph 400 may thus illustrate a dose deviation between the top portion and the sidewall portion of the fin structure as a function of the tilt angle. As depicted in the graph 400, at lower tilt angles, the dose at the top portion of the fin 402 may be significantly greater than the dose at the sidewall portion of the fin 404. As the tilt angle increases, the dose at the sidewall portion of the fin 404 may increase, and the dose at the top portion of the fin 402 may decrease. At a tilt angle of approximately 45 degrees, the dose at the top portion of the fin 402 may be approximately equal to the dose at the sidewall portion of the fin 404. The doses at the top and sidewall portions may be also be approximately equal at angles that are greater than 45 degrees.

Figure 5A:
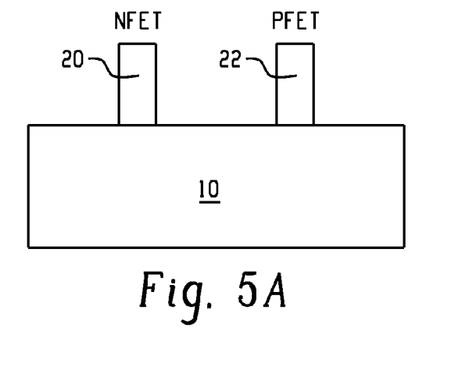
FIGS. 5A, 5B, 5C, 5D, and 5E depict cross-sectional views of intermediate stages of an example fabrication process for forming P-type and N-type fin devices of different threshold voltages.
Figure 5B:
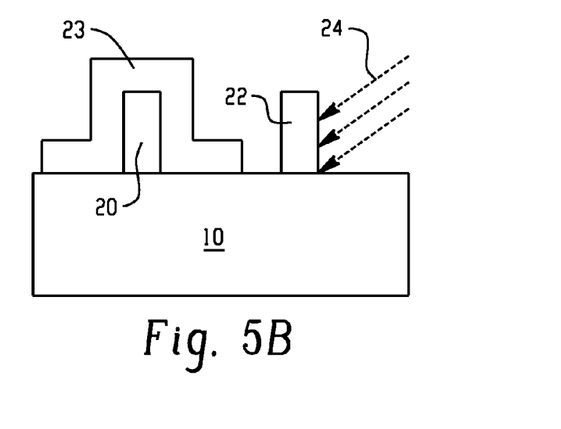
Figure 5C:
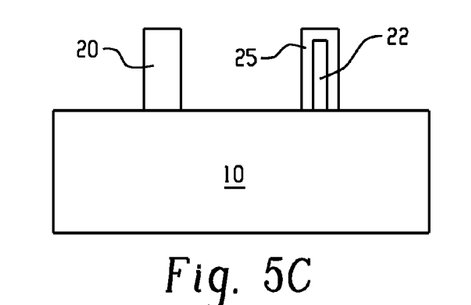

FIGS. 5A, 5B, 5C, 5D, and 5E depict cross-sectional views of intermediate stages of an example fabrication process for forming N-type and P-type fin devices 20, 22 of different threshold voltages. In FIG. 5A, fins 20 and 22 are depicted, where the fin 20 may be used to form one or more NFET devices, and where the fin 22 may be used to form one or more PFET devices. The fins 20 and 22 may be formed in a semiconductor material of the substrate 10 (e.g., as described above, with reference to FIGS. 2A, 2B, and 2C). In FIG. 5B, a mask layer 23 may be formed substantially over the fin 20, and the fin 22 may continue to be unmasked. A first germanium dopant implantation process (symbolized by arrows 24) may be used to form doped regions within the unmasked fin 22. The fin 20 that is masked by the mask layer 23 may be protected from the first germanium dopant implantation. In this manner, the NFET regions may be protected during processing of the PFET regions. FIG. 5C depicts the fin 22 as including a doped region 25 along sidewall portions and a top portion of the fin 22, where the doped region 25 may be the result of the first germanium dopant implantation. In FIG. 5C, the mask layer 23 is removed from the fin 20.

Figure 5D:
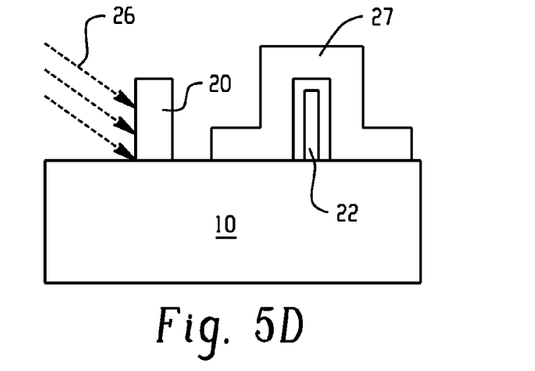
Figure 5E:
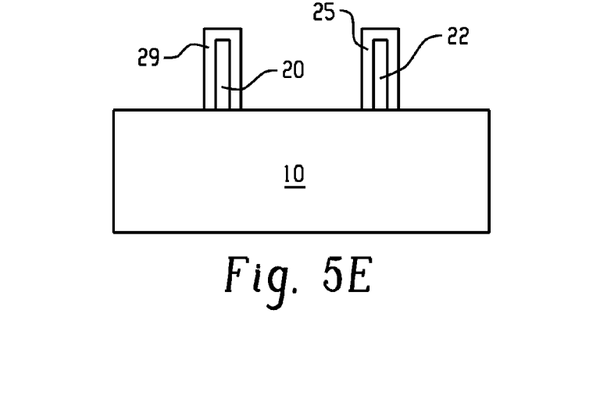

In FIG. 5D, a mask layer 27 may be formed substantially over the fin 22, and the fin 20 may continue to be unmasked. A second germanium dopant implantation process (symbolized by arrows 26) may be used to form doped regions within the fin 20. In the example of FIGS. 5B and 5D, a direction of the tilt implantations as depicted by the arrows 24, 26 is arbitrary (e.g., tilt implantations may be performed in both −X and +X tilt directions, despite the fact that only a single tilt direction is depicted in each of the FIGS. 5B and 5D). The fin 22 that is masked by the mask layer 27 may be protected from the second germanium dopant implantation. Thus, the PFET regions may be protected during processing of the NFET regions. FIG. 5E depicts the fin 20 as including a doped region 29 along sidewall portions and a top portion of the fin 20, where the doped region 29 may be formed as a result of the second germanium dopant implantation.

The selective masking of either of the NFET or PFET regions during the dopant implantation may be performed such that a threshold voltage of the NFET devices may be altered while not affecting the PFET devices, and vice versa. As described above, in examples where the fin structures are formed in a silicon material and a dopant for the dopant implantation is comprised of germanium, performing the germanium dopant implantation may increase the threshold voltage in NFET devices and decrease the threshold voltage in PFET devices. Thus, in order to increase the threshold voltage in the NFET devices without causing a corresponding decrease in the threshold voltage in the PFET devices, and vice versa, the NFET and PFET regions may be selectively masked as described in FIGS. 5A-5E. Further, by masking certain of the fins, multiple threshold voltages for FET devices may be achieved on a single chip.

Figure 6:
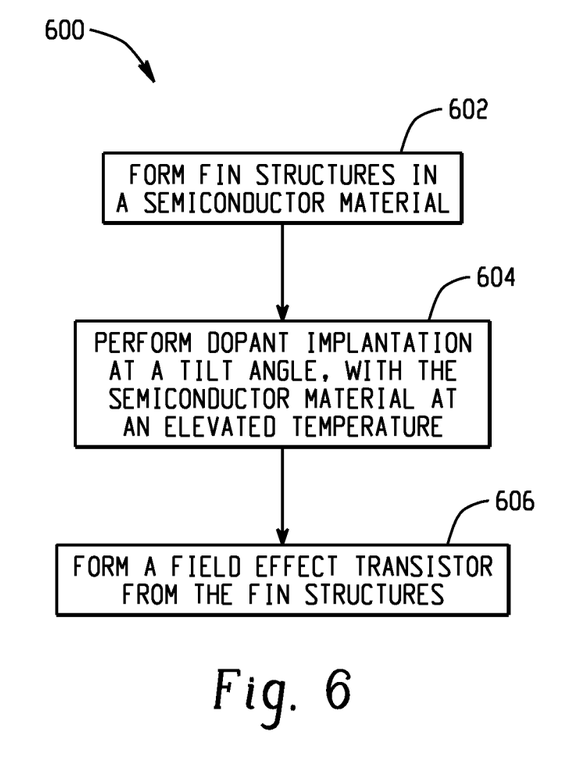
FIG. 6 is a flowchart illustrating an example method for fabrication of fin devices for an integrated circuit.

FIG. 6 is a flowchart 600 illustrating an example method for fabrication of fin devices for an integrated circuit. At 602, fin structures may be formed in a semiconductor material, where the fin structures may include sidewalls and tops. At 604, a dopant implantation may be performed at a tilt angle to form a doped region along the sidewalls and the tops of the fin structures. The semiconductor material may be maintained at an elevated temperature during the dopant implantation, where the elevated temperature may substantially prevent amorphization of the fin structures during the dopant implantation. At 606, a field effect transistor may be formed from the fin structures, where the field effect transistor may have a threshold voltage that is based on the dopant implantation.

This written description uses examples to disclose the disclosure, including the best mode, and also to enable a person skilled in the art to make and use the disclosure. The patentable scope of the disclosure may include other examples. It should be understood that as used in the description herein and throughout the claims that follow, the meaning of "a," "an," and "the" includes plural reference unless the context clearly dictates otherwise. Also, as used in the description herein and throughout the claims that follow, the meaning of "in" includes "in" and "on" unless the context clearly dictates otherwise. Further, as used in the description herein and throughout the claims that follow, the meaning of "each" does not require "each and every" unless the context clearly dictates otherwise. Finally, as used in the description herein and throughout the claims that follow, the meanings of "and" and "or" include both the conjunctive and disjunctive and may be used interchangeably unless the context expressly dictates otherwise; the phrase "exclusive of" may be used to indicate situations where only the disjunctive meaning may apply.

It is claimed:

1. A method for fabrication of fin devices for an integrated circuit, comprising:
    forming fin structures in a semiconductor material, the fin structures including sidewalls and tops;
    providing conformal masking substantially over a first set of fin structures;
    at a fin recess stage, performing a first channel implantation at a tilt angle to form a doped region along the sidewalls and the tops of un-masked second set of fin structures, the semiconductor material being maintained at an elevated temperature during the channel implantation;
    removing a mask from the first set of fin structures; and
    respectively forming at least one field effect transistor from the first set of fin structures and the second set of fin structures, wherein a conductivity type of the field effect transistor formed from the first set of fin structures differs from a conductivity type of the field effect transistor formed from the second set of fin structures, and wherein the field effect transistors formed from the second set of fin structures have a threshold voltage that is based on the channel implantation.

2. The method of claim 1, further comprising:
performing the first channel implantation using a dopant that includes germanium, wherein the doped region includes the germanium, and wherein the semiconductor material includes silicon.

3. The method of claim 1, further comprising:
changing the threshold voltage by controlling a dosage of the first channel implantation, wherein a magnitude of the change in the threshold voltage is proportional to the dosage.

4. The method of claim 1, further comprising:
heating an atmosphere in which the first channel implantation is performed, wherein a temperature of the atmosphere during the first channel implantation is greater than approximately 450 degrees Celsius; and
heating the semiconductor material during the first channel implantation, wherein the elevated temperature is greater than approximately 400 degrees Celsius.

5. The method of claim 1, further comprising:
forming the fin structures on a substrate; and
performing the first channel implantation prior to forming gate structures on the substrate.

6. The method of claim 1, further comprising:
performing the first channel implantation at the tilt angle, wherein the tilt angle is a maximum tilt angle allowed by the fin structures, wherein the maximum tilt angle causes a particular fin structure to receive a dopant without the dopant being impeded by a fin structure that is adjacent to the particular fin structure, and wherein the tilt angle is measured from a plane that is parallel to a sidewall of the particular fin structure.

7. The method of claim 1, further comprising:
performing the first channel implantation at the tilt angle, wherein the tilt angle is within a range of approximately 25 to 45 degrees, and wherein the tilt angle is measured from a plane that is parallel to a sidewall of a fin structure.

8. The method of claim 1, further comprising:
performing the first channel implantation at the tilt angle, wherein the tilt angle is greater than approximately 45 degrees, and wherein the tilt angle is measured from a plane that is parallel to a sidewall of a fin structure.

9. The method of claim 1, further comprising:
performing the first channel implantation at the tilt angle, wherein the tilt angle causes an amount of doping at the tops and the sidewalls of the fin structures to be approximately equal.

10. The method of claim 1, further comprising:
performing the first channel implantation at the tilt angle, wherein the tilt angle causes an amount of doping at uppermost portions of the sidewalls and bottom portions of the sidewalls to be approximately equal.

11. The method of claim 1, further comprising:
performing the first channel implantation, wherein the first channel implantation is performed at an energy within a range of approximately 1 KeV to 4 KeV, and wherein the first channel implantation has a dosage within a range of approximately $1 \times 10^{15}/cm^2$ to $5 \times 10^{15}/cm^2$.

12. The method of claim 1, further comprising:
forming the field effect transistor, wherein the field effect transistor formed from the first set of the fin structures is an n-type field effect transistor, and wherein performing the first channel implantation increases the threshold voltage.

13. The method of claim 1, further comprising:
forming the field effect transistor, wherein the field effect transistor formed from the first set of the fin structures includes at least one p-type field effect transistor, and wherein performing the first channel implantation decreases the threshold voltage.

14. The method of claim 1, further comprising:
performing a second channel implantation at a tilt angle to form a doped region along the sidewalls and the tops of the first set of fin structures, the semiconductor material being maintained at an elevated temperature during the second channel implantation.

15. The method of claim 14, further comprising:
performing the second channel implantation at the tilt angle, wherein the tilt angle is a maximum tilt angle allowed by the fin structures, wherein the maximum tilt angle causes a particular fin structure to receive a dopant without the dopant being impeded by a fin structure that is adjacent to the particular fin structure, and wherein the tilt angle is measured from a plane that is parallel to a sidewall of the particular fin structure.

16. The method of claim 14, further comprising:
performing the second channel implantation at the tilt angle, wherein the tilt angle is within a range of approximately 25 to 45 degrees, and wherein the tilt angle is measured from a plane that is parallel to a sidewall of a fin structure.

17. The method of claim 14, further comprising:
performing the second channel implantation at the tilt angle, wherein the tilt angle is greater than approximately 45 degrees, and wherein the tilt angle is measured from a plane that is parallel to a sidewall of a fin structure.

18. The method of claim 14, further comprising:
performing the second channel implantation at the tilt angle, wherein the tilt angle causes an amount of doping at the tops and the sidewalls of the fin structures to be approximately equal.

19. The method of claim 14, further comprising:
performing the second channel implantation at the tilt angle, wherein the tilt angle causes an amount of doping at uppermost portions of the sidewalls and bottom portions of the sidewalls to be approximately equal.

20. The method of claim 14, further comprising:
performing the second channel implantation, wherein the second channel implantation is performed at an energy within a range of approximately 1 KeV to 4 KeV, and wherein the second channel implantation has a dosage within a range of approximately $1\times10^{15}/cm^2$ to $5\times10^{15}/cm^2$.

* * * * *